(12) United States Patent
Heng

(10) Patent No.: US 6,933,170 B2
(45) Date of Patent: Aug. 23, 2005

(54) PACKAGED MICROELECTRONIC COMPONENT ASSEMBLIES

(75) Inventor: Puah Kia Heng, Tampines (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/818,228

(22) Filed: Apr. 5, 2004

(65) Prior Publication Data

US 2004/0191964 A1 Sep. 30, 2004

Related U.S. Application Data

(62) Division of application No. 10/230,616, filed on Aug. 29, 2002, now Pat. No. 6,781,066.

(30) Foreign Application Priority Data

Aug. 19, 2002 (SG) .......................................... 200204998

(51) Int. Cl.⁷ .......................... H01L 21/44; H01L 21/48; H01L 21/50
(52) U.S. Cl. ....................................... 438/106; 438/612
(58) Field of Search ............................... 438/106, 108, 438/118, 612, 613

(56) References Cited

U.S. PATENT DOCUMENTS

| | | | |
|---|---|---|---|
| 5,107,328 A | 4/1992 | Kinsman | |
| 5,128,831 A | 7/1992 | Fox, III et al. | |
| 5,138,434 A | 8/1992 | Wood et al. | |
| 5,192,682 A | 3/1993 | Kodai et al. | |
| 5,593,927 A | 1/1997 | Farnworth et al. | |
| 5,677,566 A | 10/1997 | King et al. | |
| 5,696,033 A | 12/1997 | Kinsman | |
| 5,739,585 A | 4/1998 | Akram et al. | |
| D394,844 S | 6/1998 | Farnworth et al. | |
| 5,801,073 A | 9/1998 | Robbins et al. | |
| 5,811,879 A | 9/1998 | Akram | |
| 5,815,000 A | 9/1998 | Farnworth et al. | |
| 5,817,535 A | 10/1998 | Akram | |
| D402,638 S | 12/1998 | Farnworth et al. | |
| 5,851,845 A | 12/1998 | Wood et al. | |
| 5,866,953 A | 2/1999 | Akram et al. | |
| 5,891,753 A | 4/1999 | Akram | |
| 5,893,726 A | 4/1999 | Farnworth et al. | |
| 5,894,167 A | 4/1999 | Moden et al. | |
| 5,898,224 A | 4/1999 | Akram | |
| 5,933,713 A | 8/1999 | Farnworth | |
| 5,938,956 A | 8/1999 | Hembree et al. | |
| 5,946,553 A | 8/1999 | Wood et al. | |
| 5,952,611 A | 9/1999 | Eng et al. | |
| 5,958,100 A | 9/1999 | Farnworth et al. | |
| 5,986,209 A | 11/1999 | Tandy | |
| 5,989,941 A | 11/1999 | Wensel | |
| 5,990,566 A | 11/1999 | Farnworth et al. | |

(Continued)

Primary Examiner—Phuc T. Dang
(74) Attorney, Agent, or Firm—Perkins Coie LLP

(57) ABSTRACT

Various aspects of the present invention provide microelectronic component assemblies and methods for packaging such assemblies. In one example, a microelectronic component assembly includes a substrate and a microelectronic component. This substrate has a recess in its back face and a communication opening extending through a base of the recess. This microelectronic component has an active face positioned within the substrate recess, a back face positioned outside the substrate recess, and a plurality of component contacts carried by the component active face and electrically coupled to the substrate contacts through the communication opening. This exemplary microelectronic component assembly may also include a mold compound which encapsulates the microelectronic component and a portion of the substrate active face. The mold compound may also substantially fill a gap between the periphery of the microelectronic component and a sidewall of the recess.

16 Claims, 4 Drawing Sheets

U.S. PATENT DOCUMENTS

| | | | |
|---|---|---|---|
| 5,994,784 A | 11/1999 | Ahmad | |
| RE36,469 E | 12/1999 | Wood et al. | |
| 6,000,924 A | 12/1999 | Wang et al. | |
| 6,008,070 A | 12/1999 | Farnworth | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,049,129 A | 4/2000 | Yew et al. | |
| 6,063,650 A | 5/2000 | King et al. | |
| 6,066,514 A | 5/2000 | King et al. | |
| 6,072,236 A | 6/2000 | Akram et al. | |
| 6,075,288 A | 6/2000 | Akram | |
| 6,089,920 A | 7/2000 | Farnworth et al. | |
| 6,094,058 A | 7/2000 | Hembree et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,150,717 A | 11/2000 | Wood et al. | |
| 6,159,764 A | 12/2000 | Kinsman et al. | |
| 6,172,419 B1 | 1/2001 | Kinsman | |
| 6,172,423 B1 * | 1/2001 | Lee | 257/780 |
| 6,184,465 B1 | 2/2001 | Corisis | |
| 6,198,172 B1 | 3/2001 | King et al. | |
| 6,201,299 B1 | 3/2001 | Tao et al. | |
| 6,203,967 B1 | 3/2001 | Westbrook et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,218,731 B1 | 4/2001 | Huang et al. | |
| 6,228,548 B1 | 5/2001 | King et al. | |
| 6,228,687 B1 | 5/2001 | Akram et al. | |
| 6,229,202 B1 | 5/2001 | Corisis | |
| 6,246,108 B1 | 6/2001 | Corisis et al. | |
| 6,251,703 B1 * | 6/2001 | Van Campenhout et al. | 438/106 |
| 6,258,623 B1 | 7/2001 | Moden et al. | |
| 6,258,624 B1 | 7/2001 | Corisis | |
| 6,259,153 B1 | 7/2001 | Corisis | |
| 6,268,650 B1 | 7/2001 | Kinsman et al. | |
| 6,277,671 B1 | 8/2001 | Tripard | |
| 6,284,571 B1 | 9/2001 | Corisis et al. | |
| 6,291,884 B1 | 9/2001 | Glenn et al. | |
| 6,291,894 B1 | 9/2001 | Farnworth et al. | |
| 6,294,839 B1 | 9/2001 | Mess et al. | |
| 6,299,053 B1 | 10/2001 | Kamath et al. | |
| 6,300,163 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,326,700 B1 | 12/2001 | Bai et al. | |
| 6,329,220 B1 | 12/2001 | Bolken et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,349,582 B2 | 2/2002 | Tanaka et al. | |
| 6,385,049 B1 | 5/2002 | Chia-Yu et al. | |
| 6,407,381 B1 | 6/2002 | Glenn et al. | |
| 6,423,470 B1 | 7/2002 | Scheibner et al. | |
| 6,451,709 B1 | 9/2002 | Hembree | |
| 6,503,780 B1 | 1/2003 | Glenn et al. | |
| 6,525,412 B2 | 2/2003 | Noshita | |
| 6,589,820 B1 | 7/2003 | Bolken | |
| 6,653,173 B2 | 11/2003 | Bolken | |
| 6,664,139 B2 | 12/2003 | Bolken | |
| 6,781,066 B2 * | 8/2004 | Heng | 174/260 |
| 2002/0006686 A1 | 1/2002 | Cloud et al. | |

* cited by examiner

PACKAGED MICROELECTRONIC COMPONENT ASSEMBLIES

CROSS-REFERENCE TO RELATED APPLICATIONS

This application is a divisional application of U.S. patent application Ser. No. 10/230,616, filed Aug. 29, 2002 now U.S. Pat. No. 6,781,066, "PACKAGED MICROELECTRONIC COMPONENT ASSEMBLIES," which claims foreign priority benefits of Singapore Application No. 200204998-9 filed Aug. 19, 2002, both of which are incorporated herein by reference in their entireties.

BACKGROUND

The present invention relates to microelectronic components. In particular, some aspects of the invention relate to packaged microelectronic component assemblies, e.g., BOC packages, and substrates for use in such packaged assemblies.

Many packaged microelectronic devices have a substrate, a microelectronic die attached to the substrate, and a protective covering encasing the die. The protective covering is generally a plastic or ceramic compound that can be molded to form a casing over the die. The microelectronic die can be a memory device, a microprocessor, or another type of microelectronic component having integrated circuitry. Several types of packaged devices also include bond pads on the substrate that are coupled to the integrated circuitry of the die. The bond pads may alternatively be coupled to pins or other types of terminals that are exposed on the exterior of the microelectronic device for connecting the die to buses, circuits and/or other microelectronic assemblies.

A significant limiting factor for manufacturing packaged microelectronic devices is encapsulating the die with the protective covering. The dies are sensitive components that should be protected from physical contact and environmental conditions to avoid damaging the die. The protective casing encapsulating the die, therefore, should seal the die from the environmental factors (e.g., moisture) and shield the die from electrical and mechanical shocks.

One conventional technique for encapsulating the die is known as "transfer molding," which involves placing the die and at least a portion of the substrate in a cavity of a mold and then injecting a thermosetting material into the cavity. The thermosetting material flows over the die on one side of the substrate until it fills the cavity, and then the thermosetting material is cured so that it hardens into a suitable protective casing for protecting the die. The protective casing should not have any voids over the die because contaminants from the molding process or environmental factors could damage the die. The thermosetting material, moreover, should not cover a ball pad array on the substrate or damage any electrical connections between the die and the substrate.

One drawback of transfer molding is that it is difficult to avoid producing voids in the thermosetting material. In one particular transfer-molding technique, a first protective casing is formed over the die on a first surface of the substrate, and a second protective casing is formed over contacts on the die and wire-bond connections on a second surface of the substrate. The first casing is formed from a first flow of the thermosetting compound, and the second casing is formed from a second flow of the thermosetting compound. This transfer-molding technique may result in voids along either the first or second surface of the substrate because the first and second flows may counter one another as they flow through the mold. Other transfer-molding techniques may also produce voids in the protective casing over the die because the flow of the thermosetting material in the mold may produce a first flow section that moves in a direction counter to a second flow section.

DETAILED DESCRIPTION

A. Overview

Figure 1:
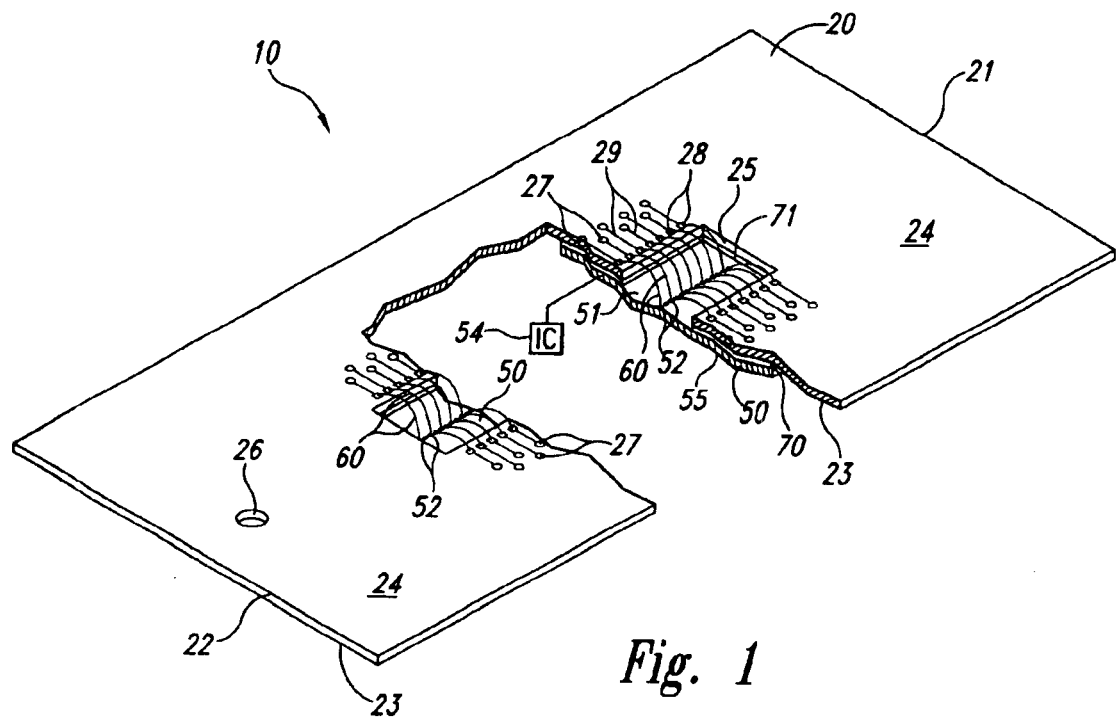
FIG. 1 is a top cutaway isometric view of a microelectronic component assembly in accordance with one embodiment of the invention.

Various embodiments of the present invention provide microelectronic component assemblies and methods for packaging microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic dies, assemblies, or components therefor.

In one embodiment, the present invention provides a microelectronic substrate that includes an active face, a back face, an outwardly-open recess in the back face, and a communication opening. The active face carries a plurality of electrical contacts. The back face is spaced from the active face. The recess has a sidewall and a base that is spaced from the active face. The communication opening extends through the base to the active surface and is proximate to each of the electrical contacts and spaced from the recess sidewall by a die attach width.

A microelectronic component assembly in accordance with another embodiment of the invention includes a substrate and a microelectronic component. The substrate has an active face carrying an array of substrate contacts, a back face spaced from the active face, a recess in the back face, and a communication opening extending through a base of the recess to the active face. The microelectronic component has an active face positioned within the substrate recess, a back face positioned outside the substrate recess, and a plurality of component contacts carried by the component active face that are electrically coupled to the substrate contacts.

An alternative embodiment provides a microelectronic component assembly including a substrate, a microelectronic component, and a mold compound. The substrate has an active face carrying an array of substrate contacts, an outwardly open recess having a sidewall, and a communication opening extending through a base of the recess to the active face. The microelectronic component has an active face, a periphery, and a plurality of component contacts carried by the component active face that are electrically coupled to the substrate contacts. The component active face is juxtaposed with the base of the recess and the component periphery is juxtaposed with the sidewalls of the recess, with a gap being defined between the periphery and the sidewalls. The mold compound encapsulates the microelectronic component and covers a portion of the substrate active face. The mold compound comprises a filler having a mean particle size larger than a width of the gap.

A method of manufacturing a microelectronic component assembly in accordance with another embodiment of the invention includes juxtaposing a microelectronic component with a substrate. The substrate has an active face, a back face, and a recess in the back face having a base that is spaced from the active face. The microelectronic component is attached to the substrate with an active surface of the microelectronic component positioned within the recess and juxtaposed with the base of the recess. A component contact carried by the component active face is electrically coupled to a substrate contact carried by the substrate active face. The microelectronic component is encapsulated in a mold compound, which covers a back face of the microelectronic component, at least a portion of the substrate back face, and at least a portion of the substrate active face.

For ease of understanding, the following discussion is broken down into three areas of emphasis. The first section discusses certain unpackaged microelectronic component assemblies and methods of manufacturing such assemblies. The second section relates to select packaged microelectronic component assemblies and methods in accordance with other embodiments of the invention.

B. Unpackaged Microelectronic Component Assemblies

FIG. 1 is a top cutaway isometric view of a microelectronic component assembly 10 in accordance with one embodiment of the invention. This microelectronic component assembly 10 generally includes a substrate 20 and a microelectronic component 50 attached to the substrate 20 by an adhesive 70. The particular embodiment of the substrate shown in FIGS. 1–3 has a first end 21, a second end 22 opposite the first end, a back face 23, and an active face 24 opposite the back face 23. The active face 24 is spaced from the back face 23 to define a thickness $T_s$ of the substrate 20. The substrate 20 may function as an interposing device that provides an array of ball pads for coupling small contacts on the microelectronic component to another type of microelectronic component. In the embodiment shown in FIG. 1, the active face 24 of the substrate 20 includes a first array of contacts, e.g., ball pads 27, and a second array of substrate contacts 28 proximate a communication opening 36 in the substrate. Each of the ball pads may be connected to an associated one of the substrate contacts 28 by a trace 29 or other type of conductive line.

Figure 2:
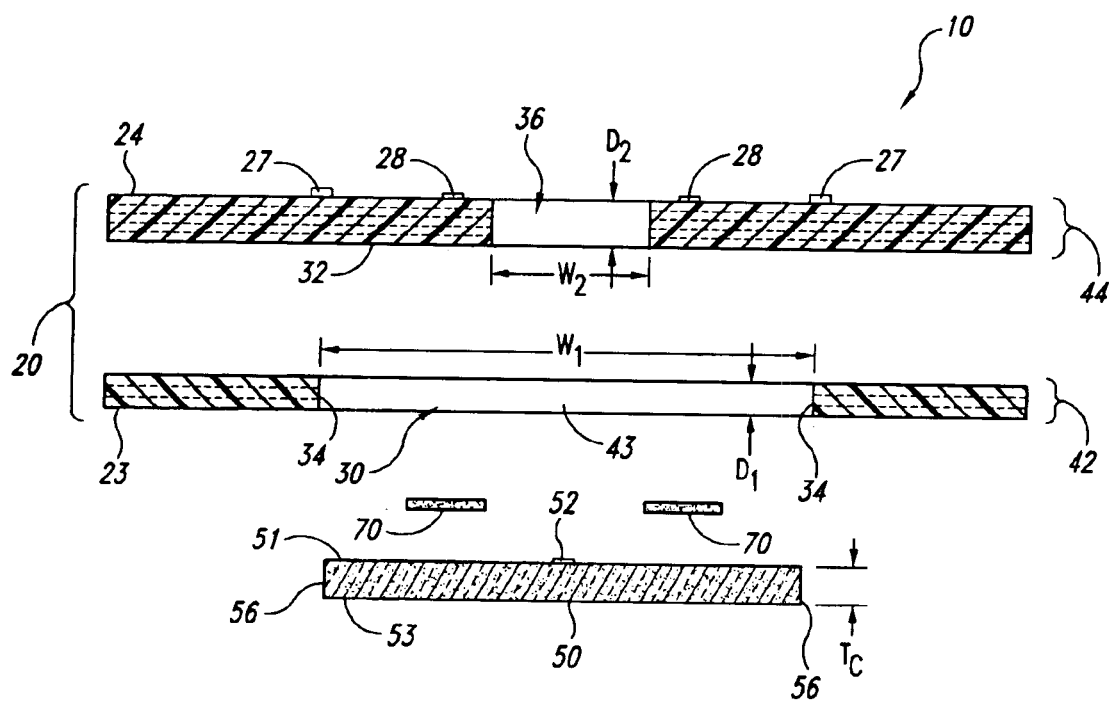
FIG. 2 is a schematic transverse cross-sectional view illustrating one stage in the manufacture of the microelectronic component assembly of FIG. 1.
Figure 3:
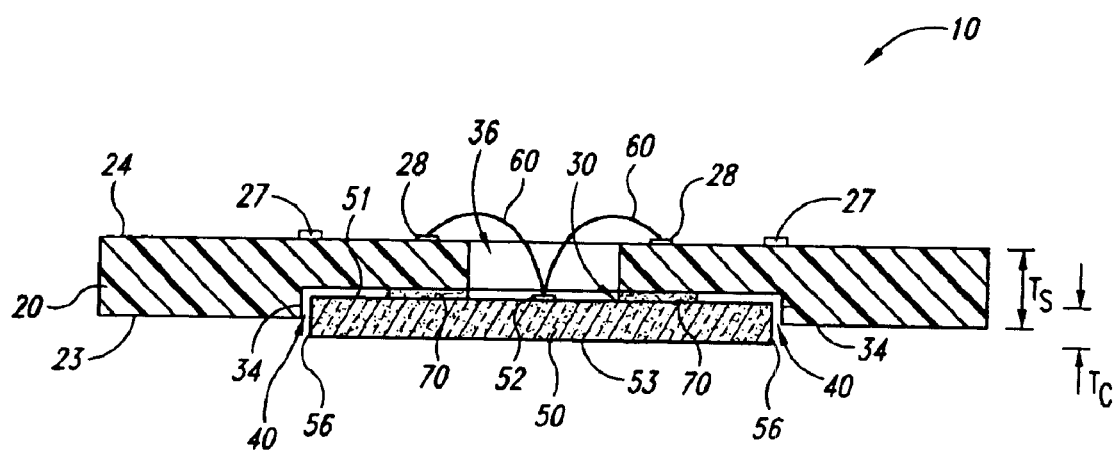
FIG. 3 schematically illustrates a subsequent stage in the manufacture of the microelectronic component assembly of FIG. 1.

The substrate 20 shown in FIG. 1 and schematically illustrated in FIGS. 2 and 3 also includes a recess 30 in the back face 23. The recess 30 is rearwardly open (i.e., open downwardly in the orientation shown in FIGS. 1–3) and has a base 32 spaced from a plane of the back face 23 by a depth $D_1$ and a sidewall 34. The communication opening 36 extends through a thickness $D_2$ of the substrate between the base 32 and the active face 24. In the illustrated embodiment, the communication opening 36 comprises an elongated slot that extends lengthwise along a medial portion of the substrate 20. The substrate 20 may also include a mold port 26 (FIG. 1) extending through the substrate 20 at a pass-through location spaced from the recess 30 and the opening 36 toward the second end 22 of the substrate 20.

The substrate 20 may be flexible or rigid and have any desired configuration. The substrate 20 may be formed of materials commonly used in microelectronic substrates, such as ceramic, silicon, glass, glass-filled resins, or combinations thereof. The substrate 20 can, alternatively, be formed of an organic material or other material suitable for printed circuit boards (PCBs). In one embodiment, the substrate 20 comprises a PCB such as an FR-4 PCB.

The depth $D_1$ of the recess 30 may be varied within a relatively broad range. In one embodiment, the depth $D_1$ is no more than about 200 $\mu$m; about 150–200 $\mu$m is expected to work well. In another embodiment, the depth $D_1$ of recess 30 is correlated to the thickness $T_s$ of the substrate 20. In one particular implementation, the depth $D_1$ is about half the thickness $T_s$ of the substrate. For a substrate having a thickness of about 0.4 millimeters (400 $\mu$m), for example, the depth $D_1$ may be on the order of 200 $\mu$m. In another embodiment discussed below, the depth $D_1$ of the recess 30 is selected to position the plane of the back face 23 of the substrate with respect to the thickness of the microelectronic component 50.

The distance $D_2$ between the base 32 of the recess 30 and the active face 24 of the substrate 20 should be sufficient to carry the conductive traces 29 or any other circuitry included in the substrate 20. In one embodiment, this distance $D_2$ is at least about 50 $\mu$m. In another embodiment, this distance $D_2$ is about 50–100 $\mu$m.

As shown in FIG. 2, the recess 30 has a transverse width $W_1$ that is greater than a transverse width $W_2$ of the communication opening 36. This leaves a die attach width of the base 32 on each side of the communication opening 36. The die attach width in the illustrated embodiment is sufficient to receive and support the adhesive 70.

The most effective means for manufacturing the substrate 20 will depend, at least in part, on the materials used in the substrate 20. The recess 30 and the communication opening 36 may, for example, be formed by mechanical machining, laser machining (e.g., laser ablation), or photoimaging techniques. In another embodiment, the recess 30 and opening 36 are integrally molded as part of the substrate 20.

In one particular manufacturing technique schematically represented in FIG. 2, the substrate 20 may comprise two or more laminated layers. A first thickness $D_1$ of the substrate 20 may be formed from a first layer 42 or a stack of first layers. The balance of the thickness of the substrate $D_2$ may be formed from a second layer 44 or a stack of second layers. The first layer 42 includes a recess opening 43 through its entire thickness having an inner surface that defines the sidewalls 34 of the recess 30. The communication opening 36 passes through the entire thickness of the second layer 44. The first layer 42 (or stack of first layers) may be stacked with the second layer 44 (or stack of second layers) and laminated to one another. Such lamination techniques are well-known in the art and need not be detailed here. Since the recess opening 43 through the first layer(s) 42 has a width $W_1$ larger than the width $W_2$ of the communication opening 36 in the second layer(s) 44, an exposed surface of the second layer 44 (or the second layer adjacent the first layer) will define the base 32 of the recess 30.

The microelectronic component 50 may comprise a single microelectronic component or a subassembly of separate microelectronic components. In the embodiment shown in FIGS. 1–3, the microelectronic component 50 is typified as a microelectronic die. In one particular embodiment, the microelectronic component 50 comprises a memory module, e.g., SIMM, DRAM, or flash memory. The microelectronic component 50 includes an array of component contacts 52 on an active face 51 of the microelectronic component and an integrated circuit 54 (shown schematically in FIG. 1) coupled to the component contacts 52. The component contacts 52 are arranged on the active face 51 in an array, which may be a linear array, as shown, or any other array which is accessible through the communication opening 36.

The microelectronic component 50 also includes a back face 53 which is spaced from the active face 51 by a component thickness $T_c$ and a periphery 56 that spans the component thickness $T_c$. As suggested in FIG. 2, the microelectronic component 10 may be manufactured by juxtaposing the microelectronic component 50 with the substrate 20. In particular, the microelectronic component 50 may be aligned with the recess 30 in the substrate 20 with the component active face 51 oriented toward the base 32 of the recess 30.

An adhesive 70 is disposed between the microelectronic component 50 and the base 32 of the recess 30. The adhesive 70 may comprise a 2-sided tape, a decal, or a quantity of an adhesive material stenciled or otherwise applied to the base 32 of the substrate recess 30 or the active face 51 of the microelectronic component 50.

Figure 7:
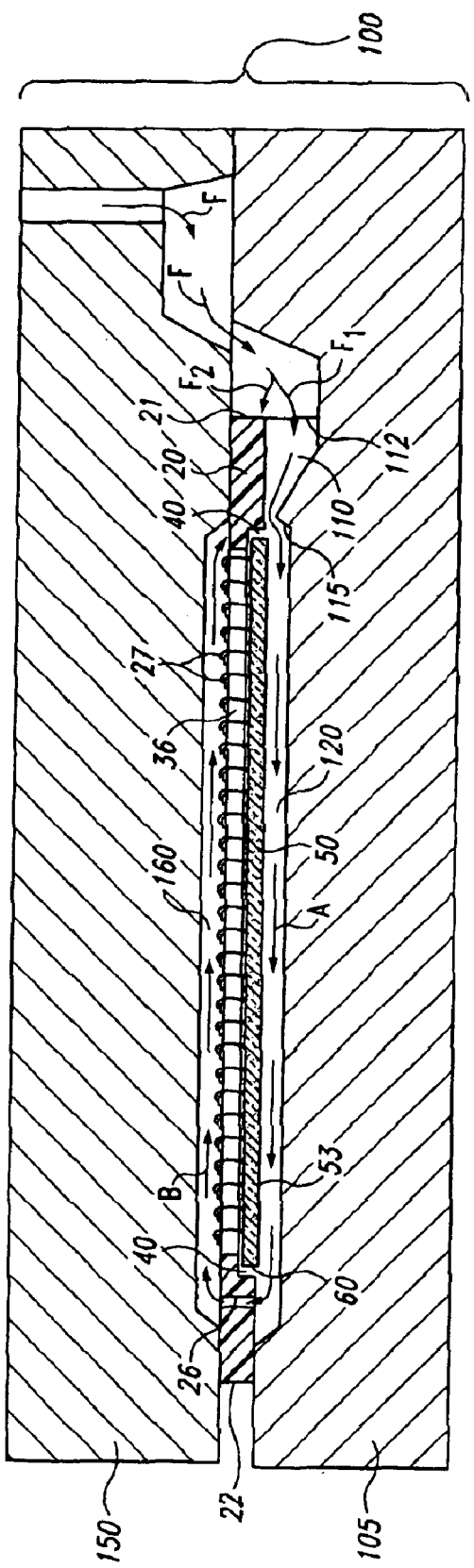
FIG. 7 is a schematic illustration corresponding to a cross-sectional view taken along line 7—7 of FIG. 6.

As shown in FIG. 3, the active face 51 of the microelectronic component 50 may be attached to the base 32 of the recess 30 by the adhesive 70. A quantity of the adhesive 70 may extend along at least a majority of the length of the communication opening 36 (as shown in FIG. 7). In this configuration, the active face 51 of the microelectronic component 50 is positioned within the recess 30. The component thickness $T_c$ is greater than the depth $D_1$ (FIG. 2) of the recess 30. As a result, the back face 53 of the microelectronic component 50 is positioned outside of the recess 30 at a location spaced outwardly from the plane of the substrate back face 23. The distance between the component back face 53 and the plane of the substrate back face 23 will depend on the difference between the depth $D_1$ of the recess 30 and the combined thickness of the adhesive 70 and the microelectronic component 50. In one embodiment, these dimensions are selected to position the plane of the substrate back face 23 approximately halfway between the active and back faces 51 and 53 of the microelectronic component 50.

For purposes of illustration, a microelectronic component 50 having a component thickness $T_c$ of about 300 µm may be attached to the base 32 of the recess 30 by an adhesive tape 70 having a thickness of about 50 µm. To position the back face 23 of the substrate about halfway between the active and back faces 51 and 53 of the microelectronic component, the recess depth $D_1$ may be about 200 µm, i.e., 50 µm (adhesive 70) plus 150 µm (one-half of the 300 µm-component thickness $T_c$).

Part of the height of the microelectronic component periphery 56 may be received within the recess 30. This will juxtapose the component periphery 56 with the recess sidewall 34, defining a gap 40 therebetween. The microelectronic component 50 may be substantially centered with respect to the base 32 of the recess 30, leaving a fairly constant gap width around the periphery 56 of the microelectronic component 50.

In one embodiment, the transverse width $W_1$ (FIG. 2) of the recess 30 is no more than 100 µm greater than the transverse width of the microelectronic component 50. The difference between the longitudinal width of the recess 30 and the longitudinal length of the microelectronic component 50 may be similarly matched. (FIG. 7 provides a schematic longitudinal cross-sectional view of the microelectronic component assembly 10 in a mold 100.) This will yield an average gap width between the microelectronic component periphery 56 and the recess sidewall 34 of about 50 µm. In one embodiment, this gap width is between about 30 µm and about 50 µm.

Once the microelectronic component 50 is attached to the substrate 20, the component contacts 52 may be coupled to the substrate contacts 28 by a plurality of connectors 60. In the illustrated embodiment, these connectors 60 are typified as wirebonds in which the bonding wire has a first end coupled to a component contact 52, a second end coupled to a substrate contact 28, and a length which extends through the communication opening 36.

The total height of the microelectronic component assembly 10 may be less than conventional board-on-chip (BOC) designs, in which no recess 30 is provided and the chip is attached to a flat back surface of the board. Some embodiments of the microelectronic component assembly 10 are particularly well-suited for inclusion in a packaged microelectronic component assembly, too.

C. Packaged Microelectronic Component Assemblies

Figure 4:
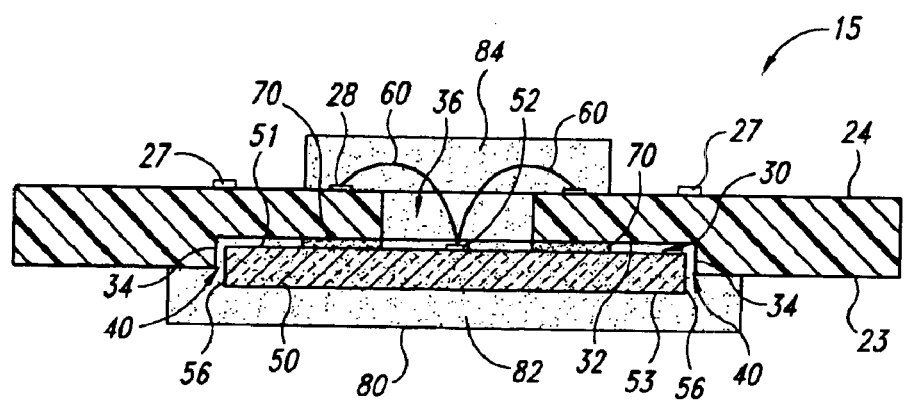
FIG. 4 is a schematic cross-sectional view of a packaged microelectronic component in accordance with an embodiment of the invention.
Figure 5:
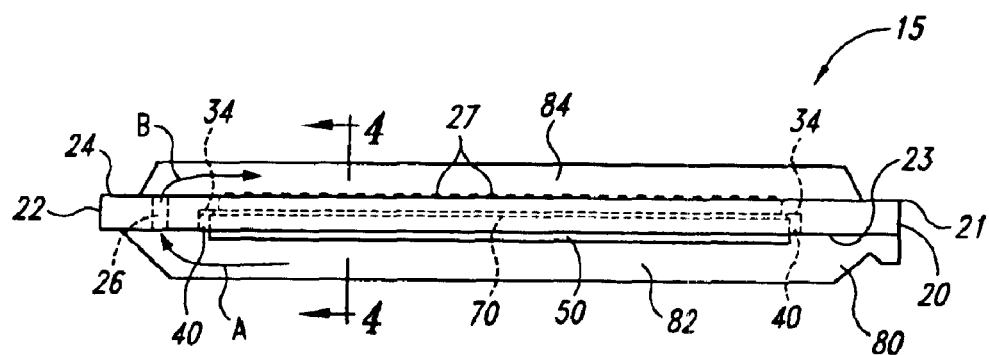
FIG. 5 is a schematic side view of the packaged microelectronic component of FIG. 4.

FIG. 5 is a side elevation view of a packaged microelectronic component assembly 15 incorporating the microelectronic component assembly 10 of FIGS. 1–3. FIG. 4 is a schematic cross-sectional view taken along line 4—4 of FIG. 5.

In FIGS. 4 and 5, the die 50 and a portion of the substrate 20 have been encapsulated by a mold compound 80. The mold compound 80 can be injected into a mold (not shown in FIGS. 4 and 5) to form a first casing 82 that encapsulates the die 50 and a second casing 84 that substantially fills the communication opening 36. The first casing 82 also covers a portion of the back surface 23 of the substrate 20, the gap 40 between the component periphery 56 and the recess sidewall 34, and may also substantially underfill the space between the component active face 51 and the base 32 of the recess 30. The second casing 84 may also cover a portion of the substrate active surface 24, the substrate contacts 28, the connectors 60, and the component contacts 52. Any conventional microelectronic mold compound may be employed; such compounds are well known in the art and are commercially available from a number of suppliers.

The first casing 82 can be formed by injecting the mold compound through a gate of a mold at the first end 21 of the substrate 20 so the mold compound flows along the back face 23 of the substrate 20 in a first direction (shown by arrow A). The second casing 84 may then be formed by driving a portion of the mold compound through the mold port 26 toward the second end 22 of the substrate 20. The mold port 26 defines a pass-through location that is spaced apart from the first end 21 of the substrate 20 and the recess 30 to generate a second flow of compound along the active face 24 of the substrate 20 (shown by arrow B). The second flow of mold compound moves in a second direction away from the second end 22 of the substrate 20 toward the first end 21.

In a conventional board-on-chip (BOC) package, the active surface of the die is spaced above the back surface of the substrate by the thickness of a die attach tape, which may be 50 µm or more. The process of fabricating such a conventional BOC package can be difficult because the mold compound may flow through the space between the chip and the substrate at the first end of the wire bonding slot. This leakage or counterflow of mold compound would move counter to the second flow of mold compound along the front face of the board. As a result, voids or other disparities may be created in the casing intended to encapsulate the wire bonds.

Figure 6:
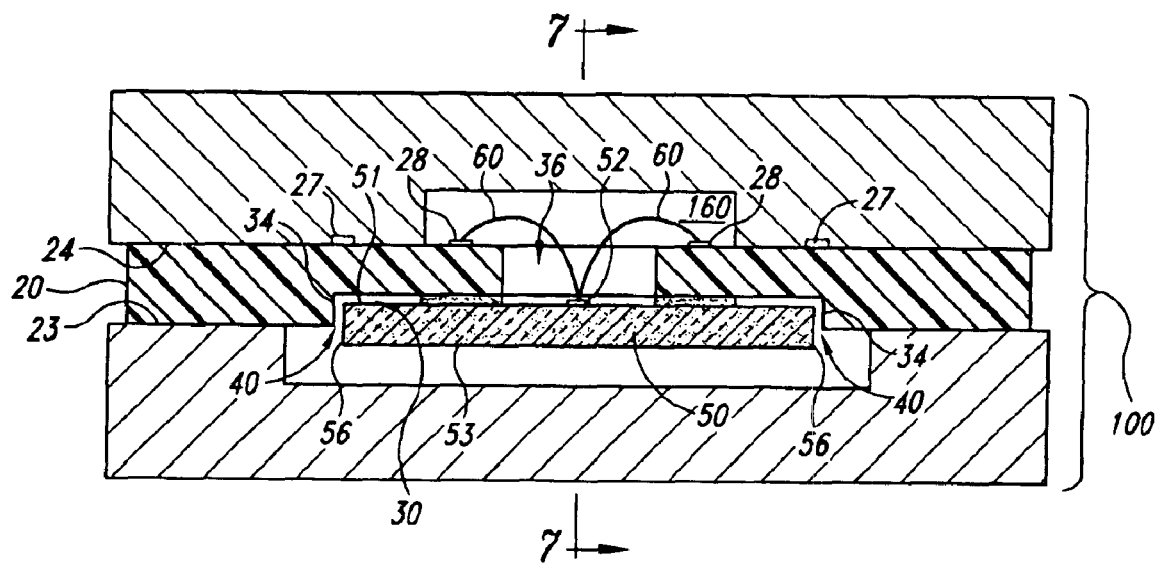
FIG. 6 schematically illustrates a stage in packaging the microelectronic component assembly of FIG. 4.

FIG. 6 is a schematic transverse cross-sectional view of the microelectronic component assembly 10 of FIGS. 1–3 in a mold 100. FIG. 7 is a schematic longitudinal cross-sectional view taken along line 7—7 of FIG. 6. The mold 100 includes a first mold section 105 and a second mold section 150. The first mold section 105 has a first cavity 120 and the second mold section 150 has a second mold cavity 160. The second mold section 150 is superimposed over the first mold section 105 so that the second cavity 160 is positioned over the first cavity 120 of the first mold section 105.

Mold compound injected into the mold 100 (indicated by arrows F) will flow through a gate 110 into the first cavity 120. Thereafter, the mold compound will flow through the mold port 26 and along the second cavity 160 (arrow B). If so desired, a flow restrictor 115 may be disposed at the end of the gate 110.

In conventional BOC packaging, the flow of mold compound into the mold will encounter the periphery of the chip and be forced to flow upwardly over the entire thickness of the chip. In the embodiment illustrated in FIGS. 6 and 7, a portion of a thickness of the microelectronic component 50 is received within the recess 30 of the substrate 20. The adhesive 70 is also received entirely within the recess 30. As a result, the mold compound flowing through the gate 110 need only clear the portion of the microelectronic component 50 extending outwardly beyond the back face 23 of the substrate 20. This can appreciably improve the fluid dynamics of the mold compound flow in the first cavity 120 (indicated by arrow A).

Disposing a portion of the microelectronic component 50 within the recess 30 of the substrate 20 can also limit, if not substantially eliminate, inadvertent flow of the mold compound between the microelectronic component 50 and the substrate 20 adjacent the first end 21 of the substrate 20. To pass from the first cavity 120 to the second cavity 160 adjacent the gate 110, the mold compound would have to flow through the gap 40 between the component periphery 56 and the recess sidewall 34 near the first end 21 of the substrate 20. Thereafter, the mold compound would have to flow between the active surface 51 of the microelectronic component 50 and the base 32 of the recess 30. This presents a more tortuous path, restricting the inadvertent flow of the mold compound along this pathway. Appropriate selection of the width of the gap 40 can further restrict this flow.

Conventional mold compounds Include a flowable component, e.g., a curable resin, and a filler, which may comprise particulate silica or other relatively inexpensive materials. If so desired, the width of the gap 40 may be less than or equal to the mean particle size of the filler. In one embodiment, the gap 40 is no wider than about 50 $\mu$m and the filler in the maid compound has a mean particle size of 50 $\mu$m or greater. In one specific embodiment, the width of the gap 40 is about 30–50 $\mu$m and the mean particle size of the filler in the mold compound is about 70 $\mu$m or greater. A gap width equal to or less than the mean particle size of the mold compound filler significantly limits the passage of filler particles into the recess 30. This, in turn, can reduce or substantially eliminate problems that could arise if a particle of the filler becomes wedged between the substrate 20 and the active face 51 of the microelectronic component 50.

U.S. patent application Publication Ser. No. U.S. 2002/0016023 ("Bolken"), the entirety of which is incorporated herein by reference, suggests a method and mold design which can limit the backflow of mold compound from the first cavity 120 to the second cavity 160 adjacent the first end 21 of the substrate 20. In certain embodiments of that disclosure, the flow of mold compound into the first cavity is bifurcated to flow along opposite sides of the microelectronic die. The mold 100 of FIG. 7 includes an island 112 adjacent the gate 110. As explained in the Bolken publication, such an island 112 can split the injection flow F into a first flow $F_1$ and a second flow $F_2$ and deliver these flows $F_1$ and $F_2$ into the first cavity 120 through laterally spaced-apart gates 110. Bifurcating the flow in this fashion can further limit the backflow of mold compound from the first cavity 120 to the second cavity 160 adjacent the first end 21 of the substrate 20.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. Aspects of the invention may also be useful in other applications, e.g., in manufacturing lead-on-chip (LOC) microelectronic component assemblies. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

What is claimed is:

1. A method of manufacturing a microelectronic component assembly, comprising;

juxtaposing a microelectronic component with a substrate, the substrate having an active face, a back face, and a recess in the back face having a base that is spaced from the active face;

attaching the microelectronic component to the substrate with an active face of the microelectronic component positioned within the recess and juxtaposed with the base of the recess;

electrically coupling a component contact carried by the component active face to a substrate contact carried by the substrate active face; and applying a mold compound to cover a back face of the microelectronic component, at least a portion of the substrate back face, and at least a portion of the substrate active face with the mold compound.

2. The method of claim 1 wherein applying the mold compound comprises defining a mold cavity within which the microelectronic component and at least the recess of the substrate is positioned and delivering the mold compound to the mold cavity.

3. The method of claim 1 wherein applying the mold compound comprises delivering the mold compound to a first portion of a mold cavity on a first side of the substrate and flowing the mold compound to a second portion of the mold cavity on an opposite side of the substrate through a mold port extending through the substrate.

4. The method of claim 1 wherein the substrate includes a communication opening through the bottom of the recess to the substrate active face and applying the mold compound comprises flowing the mold compound through the substrate via a mold port extending through the substrate at a location spaced from the communication opening.

5. The method of claim 1 wherein the microelectronic component has a periphery spaced from an inner face of the recess by a gap, applying the mold compound comprising delivering the mold compound to a mold cavity, the mold compound comprising a flowable component and a filler having a mean particle size larger than a width of the gap.

6. The method of claim 1 wherein electrically coupling the component contact to the substrate contact comprises passing a connector through an opening in the bottom of the recess.

7. The method of claim 6 wherein applying the mold compound comprises covering the connector with the mold compound and substantially filling the opening with the mold compound.

8. A method of manufacturing a microelectronic component assembly, comprising:

juxtaposing a microelectronic component with a substrate, the substrate having an active face, a back face, and a recess in the back face, wherein the recess has a sidewall and a base and the base is spaced from the active face;

attaching the microelectronic component to the substrate with an active face of the microelectronic component positioned within the recess and juxtaposed with the base of the recess and with a periphery of the microelectronic component being juxtaposed with the sidewall of the recess to define a gap therebetween;

electrically coupling a component contact carried by the component active face to a substrate contact carried by the substrate active face; and covering a portion of the microelectronic component with a mold compound, the mold compound including a first component and a filler having a mean particle size at least as large as a width of the gap.

9. The method of claim 8 wherein covering a portion of the microelectronic component comprises disposing a portion of the first component in the gap.

10. The method of claim 8 wherein covering a portion of the microelectronic component comprises applying the mold compound to cover a back face of the microelectronic component, at least a portion of the substrate back face, and at least a portion of the substrate active face with the mold compound.

11. The method of claim 8 wherein electrically coupling the component contact to the substrate contact comprises passing a connector through an opening in the bottom of the recess.

12. The method of claim 11 wherein covering a portion of the microelectronic component comprises covering the connector with the mold compound and substantially filling the opening with the mold compound.

13. A method of manufacturing a microelectronic component assembly, comprising:

attaching a component surface of a microelectronic component to a die attach surface of a substrate, wherein the substrate has first and second surfaces spaced apart by a substrate thickness, the die attach surface is spaced from a plane of the first surface by a reduced thickness that is less than the substrate thickness, and a sidewall extends from the second surface to the die attach surface;

electrically coupling a component contact carried by the component surface to a substrate contact carried by the first surface of the substrate with a connector, the connector extending through an opening through the reduced thickness; and covering a portion of the microelectronic component with a mold compound, the mold compound including a first component and a filler having a mean particle size at least as large as a width of a gap between a periphery of the microelectronic component and the sidewall of the substrate.

14. The method of claim 13 wherein covering a portion of the microelectronic component comprises disposing a portion of the first component in the gap.

15. The method of claim 13 wherein covering a portion of the microelectronic component comprises applying the mold compound to cover a back face of the microelectronic component, at least a portion of each of the first and second surfaces of the substrate with the mold compound.

16. The method of claim 13 wherein covering a portion of the microelectronic component comprises covering the connector with the mold compound and substantially filling the opening with the mold compound.

* * * * *

UNITED STATES PATENT AND TRADEMARK OFFICE
CERTIFICATE OF CORRECTION

PATENT NO. : 6,933,170 B2
DATED : August 23, 2005
INVENTOR(S) : Puah Kia Heng

It is certified that error appears in the above-identified patent and that said Letters Patent is hereby corrected as shown below:

Column 7,
Line 46, "Include" should be -- include --;
Line 52, "maid" should be -- mold --;
Line 59, "that" should be -- which --.

Signed and Sealed this

Twenty-eighth Day of February, 2006

JON W. DUDAS
*Director of the United States Patent and Trademark Office*